US012562739B2

(12) United States Patent
Tsai et al.

(10) Patent No.: US 12,562,739 B2
(45) Date of Patent: Feb. 24, 2026

(54) POWER-ON CONTROL CIRCUIT AND INTEGRATED CIRCUIT HAVING MULTIPLE POWER DOMAINS

(71) Applicant: M31 TECHNOLOGY CORPORATION, Hsinchu County (TW)

(72) Inventors: Ming-Yen Tsai, Hsinchu County (TW); Tze-Hsiang Chao, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 18/735,128

(22) Filed: Jun. 5, 2024

(65) Prior Publication Data

US 2025/0379579 A1     Dec. 11, 2025

(51) Int. Cl.
H03K 17/22       (2006.01)
H03K 19/00       (2006.01)
H03K 19/0185     (2006.01)

(52) U.S. Cl.
CPC ..... H03K 19/0016 (2013.01); H03K 19/0013 (2013.01); H03K 19/018521 (2013.01)

(58) Field of Classification Search
CPC ...... H03K 17/22; H03K 17/223; H03K 17/24; H03K 19/0008; H03K 19/0013;
(Continued)

(56) References Cited

U.S. PATENT DOCUMENTS 7,307,454 B1 * 12/2007 Wert .................... H03K 17/223
                                                        326/81
9,461,648 B1   10/2016 Lee et al.
(Continued)

FOREIGN PATENT DOCUMENTS

TW         202411986 A    3/2024
TW          I844479 B     6/2024

OTHER PUBLICATIONS

Office Action issued by TIPO dated Jan. 20, 2026 for TW 114114170.
(Continued)

*Primary Examiner* — Long Nguyen
(74) *Attorney, Agent, or Firm* — WPAT, P.C.; Anthony King

(57)          ABSTRACT

A power-on control circuit includes a signal processing circuit, a first level shifter and a voltage tracking circuit. The signal processing circuit is configured to generate a power-on control signal according to a first tracking signal operative in a first power domain of the integrated circuit. The first level shifter is configured to generate the first tracking signal according to a second tracking signal operative in a second power domain of the integrated circuit. The second power domain is different from the first power domain. The voltage tracking circuit is powered by a first supply voltage operative in the first power domain and a second supply voltage operative in the second power domain. The voltage tracking circuit is configured to, when the second supply voltage is ready, track the first supply voltage according to the power-on control signal, and accordingly generate the second tracking signal.

20 Claims, 9 Drawing Sheets

(58) Field of Classification Search
CPC ........... H03K 19/0016; H03K 19/0175; H03K 19/017509; H03K 19/0185; H03K 19/018507; H03K 19/018514; H03K 19/018521; H03K 19/018528; G06F 1/24
See application file for complete search history.

(56) References Cited

U.S. PATENT DOCUMENTS

| | | | |
|---|---|---|---|
| 12,400,687 B2 | 8/2025 | Dudovitch | |
| 2010/0085079 A1* | 4/2010 | Campbell | ................ G11C 5/14 |
| | | | 326/68 |
| 2025/0103228 A1 | 3/2025 | Wu et al. | |

OTHER PUBLICATIONS

English Summary of the Office Action issued by TIPO dated Jan. 20, 2026 for TW 114114170.
US 12400687 B2 is the counterpart to TW 202411986 A.
US 0250103228 A1 is the counterpart to TW 1844479 B.

* cited by examiner

POWER-ON CONTROL CIRCUIT AND INTEGRATED CIRCUIT HAVING MULTIPLE POWER DOMAINS

BACKGROUND

The present disclosure relates to power-on control and, more particularly, to a power-on control circuit, and an integrated circuit having multiple power domains.

The continuing trends in functional integration makes a system-on-chip (SoC) design far more sophisticated and powerful. However, designers face the challenge of maximizing power efficiency while achieving a higher level of integration. To reduce power consumption, an SoC may be divided into different power domains which can withstand different voltage levels, respectively. A power domain refers to a collection of design blocks or instances that share a same supply voltage. The multiple power domain design can allow different circuit blocks of the SoC to continue running with just enough power, thereby reducing dynamic and static power consumption. In addition, the multiple power domain design can turn off unused power domain, in which circuit blocks can be disabled to reduce leakage power consumption.

SUMMARY

The described embodiments provide a power-on control circuit and an integrated circuit having multiple power domains.

Some embodiments described herein may include a power-on control circuit for an integrated circuit. The power-on control circuit includes a signal processing circuit, a first level shifter and a voltage tracking circuit. The signal processing circuit is configured to generate a power-on control signal according to a first tracking signal operative in a first power domain of the integrated circuit. The first level shifter, coupled to the signal processing circuit, is configured to generate the first tracking signal according to a second tracking signal operative in a second power domain of the integrated circuit. The second power domain is different from the first power domain. The voltage tracking circuit is coupled to the first level shifter, and powered by a first supply voltage operative in the first power domain and a second supply voltage operative in the second power domain. The voltage tracking circuit is configured to, when the second supply voltage is ready, track the first supply voltage according to the power-on control signal, and accordingly generate the second tracking signal.

Some embodiments described herein may include an integrated circuit having multiple power domains. The integrated circuit includes an input/output (I/O) circuit and a power-on control circuit. The I/O circuit is controlled by a power-on control signal. The I/O circuit includes a first signal generator circuit powered by a first supply voltage and a second supply voltage. The first signal generator is configured to receive an input signal, and generate an output signal according to the power-on control signal. The first supply voltage and the input signal are operative in a first power domain of the integrated circuit. The second supply voltage and the output signal are operative in a second power domain of the integrated circuit. The power-on control circuit is coupled to the first signal generator circuit, and configured to generate the power-on control signal. The power-on control circuit includes a second signal generator circuit and a voltage tracking circuit. The second signal generator circuit is configured to generate the power-on control signal according to a tracking signal operative in the second power domain. The voltage tracking circuit is coupled to the second signal generator circuit, and powered by the first supply voltage and the second supply voltage. The voltage tracking circuit is configured to, when the second supply voltage is ready, track the first supply voltage according to the power-on control signal, and accordingly generate the tracking signal.

With the use of the proposed voltage tracking scheme, the power-on control circuit can track the behavior of an interface circuit between different power domains in an I/O circuit, thereby generating a power-on control signal indicative of whether a core voltage reaches a minimum level sufficient for the I/O circuit to operate properly. In addition, the power-on control circuit can reduce/prevent the occurrence of an ambiguous region, which can cause a functioning block in a powered up domain to exhibit unpredictable behavior.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
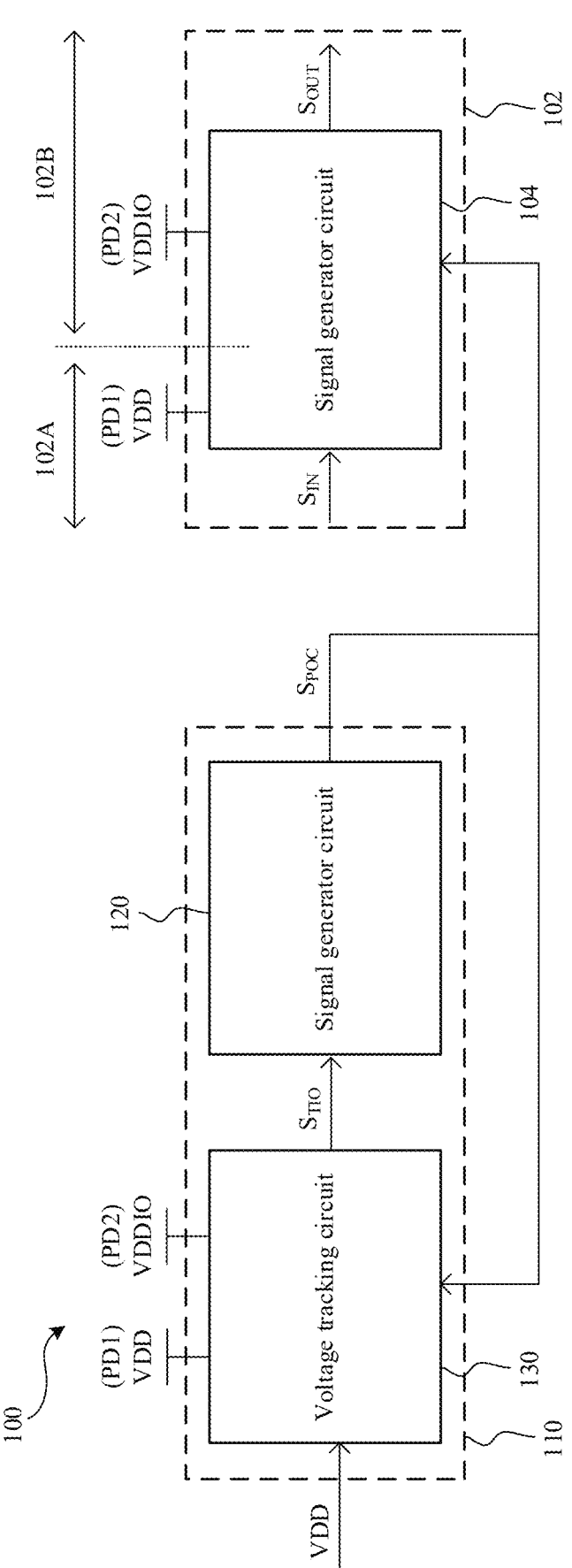
FIG. 1 is a diagram illustrating an exemplary integrated circuit having multiple power domains in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In a circuit system having multiple power domains, unwanted propagation of signals from a powered off domain to a powered up domain would cause glitches in a functioning block in the powered up domain. A power-on control (POC) cell can be used to reduce/avoid glitches caused by an incorrect power-on sequence of power supplies. For example, the POC cell can be configured to put the functioning block in a reset state for a period of time to wait for the powered off domain to become active. This period of time, however, is determined independently of operation of the functioning block. It is likely that the POC cell still releases the functioning block before the powered off domain becomes active. Thus, there may be a time interval between when the POC cell releases the functioning block and when the powered off domain becomes active. The functioning block may exhibit unpredictable behavior during this time interval, which is referred to as an ambiguous region.

The present disclosure describes exemplary POC circuits for an integrated circuit. The exemplary POC circuit can emulate a response of an I/O circuit to a power-on sequence of different supply voltages, and accordingly generate a POC signal that can indicate whether a core voltage reaches a minimum level sufficient for the I/O circuit to operate properly. In addition, the exemplary POC circuit can reduce/prevent the occurrence of the aforementioned ambiguous region at different corners of process, voltage, and temperature (PVT). Further description is provided below.

FIG. 1 is a diagram illustrating an exemplary integrated circuit having multiple power domains in accordance with some embodiments of the present disclosure. The integrated circuit 100 may have different power domains PD1 and PD2, which are supplied with the supply voltages VDD and VDDIO respectively. By way of example but not limitation, the supply voltage VDD may be a core voltage provided for a processor core or internal logic blocks, and the supply voltage VDDIO may be an input/output (I/O) voltage provided for I/O circuitry. The power domains PD1 and PD2 may be referred to as a core domain and an I/O domain, respectively.

The integrated circuit 100 includes, but is not limited to, an I/O circuit 102 and a POC circuit 110. The I/O circuit 102 is arranged to support communication between a core of the integrated circuit 100 (not shown) and external pins of the integrated circuit 100 (not shown). A first part 102A of the I/O circuit 102 is located in the power domain PD1, and powered by the supply voltage VDD; a second part 102B of the I/O circuit 102 is located in the power domain PD2, and powered by the supply voltage VDDIO. The second part 102B can use an output signal from the first part 102A as an input signal thereof. The I/O circuit 102 can be controlled by a POC signal $S_{POC}$ to maintain the proper functioning of the second part 102B. The POC signal $S_{POC}$ can indicate whether the supply voltage VDDIO becomes ready before the supply voltage VDD.

For example, when the supply voltage VDDIO is ready and the supply voltage VDD is unready, the second part 102B might receive from the first part 102A an output signal having an unknown state, which would cause glitches in the second part 102B. With the use of the POC signal $S_{POC}$, the output signal of the first part 102A can be set to a predetermined level (i.e. a known state), thereby reducing/avoiding glitches caused by an incorrect power-on sequence of power supplies.

In the present embodiment, the I/O circuit 102 may include a signal generator circuit 104, which can serve as an interface circuit between the power domains PD1 and PD2. The signal generator circuit 104, powered by the supply voltages VDD and VDDIO, can be configured to receive an input signal $S_{IN}$ operative in the power domain PD1. In addition, the signal generator circuit 104 can be configured to generate an output signal $S_{OUT}$ operative in the power domain PD2 according to the POC signal $S_{POC}$. When the power-on control signal $S_{POC}$ is at a first logic level, a signal level of the output signal $S_{OUT}$ can be set to a predetermined level; when the power-on control signal $S_{POC}$ is at a second logic level different from the first logic level, the signal level of the output signal $S_{OUT}$ can be determined according to the input signal $S_{IN}$. Thus, the output signal $S_{OUT}$ sent to the power domain PD2 can have a definite level.

The POC circuit 110, coupled to the signal generator circuit 104, can be configured to generate the POC signal $S_{POC}$ by tracking the behavior of the signal generator circuit 104 associated with the power-on sequence of the supply voltages VDD and VDDIO. The POC signal $S_{POC}$ can indicate if the supply voltage VDD is unready for use by the signal generator circuit 104 while the supply voltage VDDIO is already ready.

The POC circuit 110 may include a signal generator circuit 120 and a voltage tracking circuit 130. The signal generator circuit 120 is configured to generate the POC signal $S_{POC}$ according to a tracking signal $S_{TIO}$ operative in the power domain PD2. The voltage tracking circuit 130, coupled to the signal generator circuit 120, is powered by the supply voltages VDD and VDDIO. The voltage tracking circuit 130 can be configured to emulate the operation of the signal generator circuit 104 to generate the tracking signal $S_{TIO}$. In the present embodiment, when the supply voltage VDDIO is ready, the voltage tracking circuit 130 is configured to track the supply voltage VDD according to the POC signal $S_{POC}$, and accordingly generate the tracking signal $S_{TIO}$. The tracking signal $S_{TIO}$ can indicate if the supply voltage VDD reaches a level sufficient for the signal generator circuit 104 to operate properly.

By way of example but not limitation, the voltage tracking circuit 130 can be a replica of the signal generator circuit 104. The response of the voltage tracking circuit 130 to the power-on sequence of the supply voltages VDD and VDDIO is equivalent to, or substantially equivalent to, the response of the signal generator circuit 104 to the power-on sequence of the supply voltages VDD and VDDIO. As another example, the signal generator circuit 104 may include a pull-up circuit path and a pull-down circuit path (not shown), each of which is arranged to change a signal level of the output signal $S_{OUT}$. The pull-up and pull-down circuit paths may fight each other during the power-on or power-off sequence. The voltage tracking circuit 130 may emulate the response of the signal generator circuit 104 to the fighting pull-up and pull-down circuit paths, thereby generating the tracking signal $S_{TIO}$.

In operation, when the supply voltage VDDIO becomes ready and the supply voltage VDD is unready, the POC signal $S_{POC}$ is at a first logic level, and the signal generator circuit 104 can set the output signal $S_{OUT}$ to a predetermined level. The voltage tracking circuit 130 can generate the tracking signal $S_{TIO}$ by detecting if the supply voltage VDD reaches a first threshold level to become ready for use. When the tracking signal $S_{TTO}$ indicates that the supply voltage VDD reaches the first threshold level, the signal generator circuit 120 can generate the POC signal $S_{POC}$ at a second logic level different from the first logic level. The signal generator circuit 104 can generate the output signal $S_{OUT}$ according to the input signal $S_{IN}$.

In other words, the POC signal $S_{POC}$ can stay at the first logic level before the supply voltage VDD reaches the first threshold level to become ready for use by the signal generator circuit 104. In addition, the POC signal $S_{POC}$ can transition from the first logic level to the second logic level when or after the supply voltage VDD reaches the first threshold level to become ready for use by the signal generator circuit 104.

Moreover, when the POC signal $S_{POC}$ is at the second logic level, the voltage tracking circuit 130 can generate the tracking signal $S_{TTO}$ by detecting if the supply voltage VDD reaches a second threshold level to become unready for use. For example, when each of the supply voltages VDD and VDDIO is ready, the voltage tracking circuit 130 can detect if the supply voltage VDD become unready before the supply voltage VDDIO. When the tracking signal $S_{TTO}$ indicates that the supply voltage VDD reaches the second threshold level to become unready, the POC signal $S_{POC}$ outputted from the signal generator circuit 120 can transition to the first logic level. The signal generator circuit 104 can set the output signal $S_{OUT}$ to the predetermined level.

With the use of the voltage tracking circuit 130, the POC circuit 110 can track the behavior of an interface circuit between different power domains in the I/O circuit 102 (e.g. the signal generator circuit 104), thereby generating the POC signal $S_{POC}$ that is capable of indicating if the supply voltage VDDIO is already available while the supply voltage VDD is unavailable to the I/O circuit 102. The functioning block (e.g. a driver circuit), arranged for receiving an input signal from the signal generator circuit 104, can be released from a reset state when or after each of the power domains PD1 and PD2 becomes available. In addition, as the POC circuit 110 generates the POC signal $S_{POC}$ by tracking the behavior of the I/O circuit 102, the POC circuit 110 can reduce/prevent the occurrence of an ambiguous region at different corners of process, voltage, and temperature (PVT).

To facilitate understanding of the present disclosure, some embodiments are given as follows for further description of the proposed POC scheme. Those skilled in the art should appreciate that other embodiments employing the architecture shown in FIG. 1 are also within the contemplated scope of the present disclosure.

Figure 2:
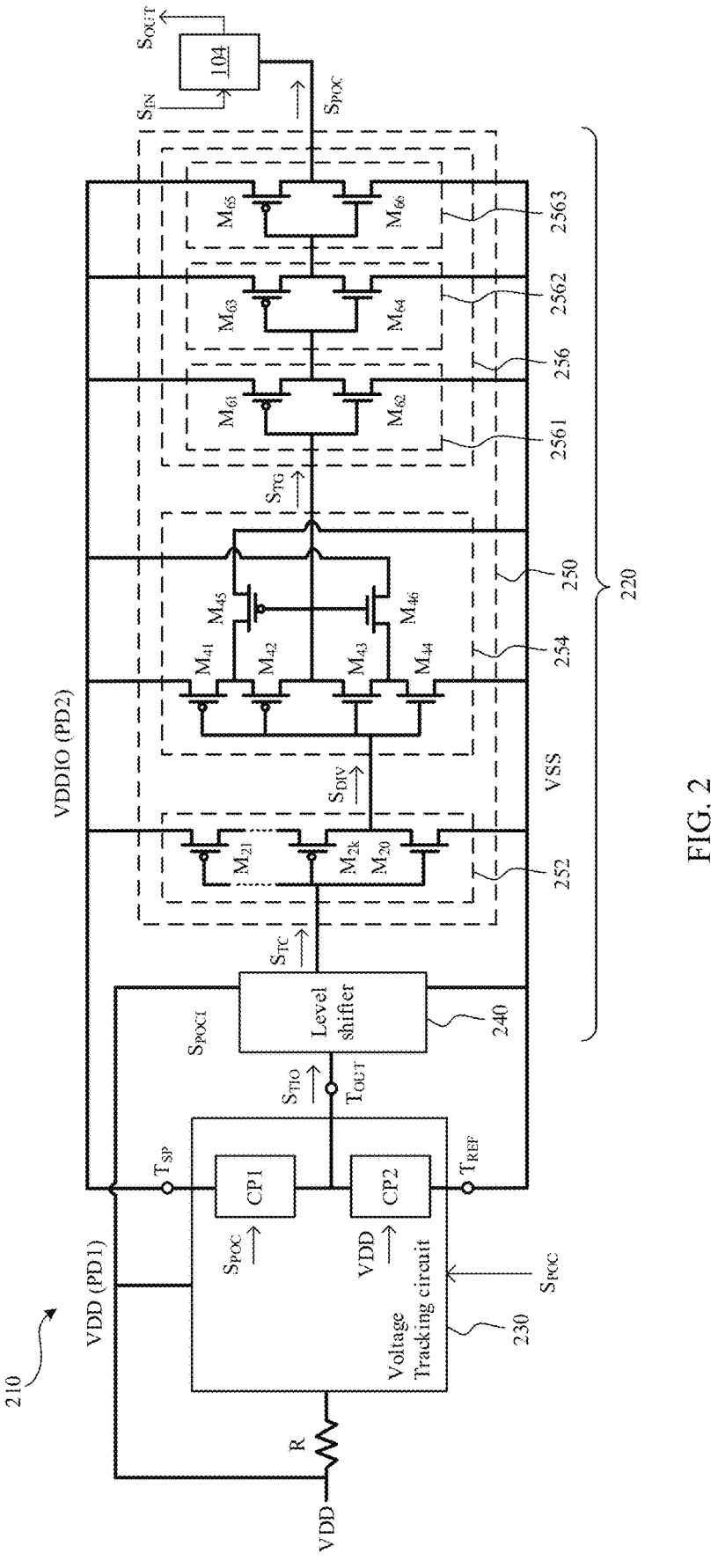
FIG. 2 illustrates an implementation of the power-on control circuit shown in FIG. 1 in accordance with some embodiments of the present disclosure.

FIG. 2 illustrates an implementation of the POC circuit 110 shown in FIG. 1 in accordance with some embodiments of the present disclosure. The POC circuit 210 includes a signal generator circuit 220 and a voltage tracking circuit 230, which can serve as embodiments of the signal generator circuit 120 and the voltage tracking circuit 130 shown in FIG. 1, respectively. In the present embodiment, the signal generator circuit 220 may include a level shifter 240 and a signal processing circuit 250. The level shifter 240 can be powered by the supply voltage VDD operative in the power domain PD1, and the signal processing circuit 250 can be powered by the supply voltage VDDIO operative in the power domain PD2.

The level shifter 240, coupled to the voltage tracking circuit 230, is configured to generate a tracking signal $S_{TC}$ operative in the power domain PD1 according to the tracking signal $S_{TTO}$ operative in the power domain PD2. Note that the level shifter 240 can be implemented using various types of level shifters (e.g. an inverter-type shifter, a buffer-type level shifter, a latch-type level shifter, a voltage mode level shifter or a current mode level shifter) without departing from the scope of the present disclosure.

The signal processing circuit 250, coupled to the level shifter 240, is configured to generate the POC signal $S_{POC}$ according to the tracking signal $S_{TC}$. In the example of FIG. 2, the signal processing circuit 250 may include, but is not limited to, a voltage divider 252, a Schmitt trigger 254 and a buffer circuit 256. Note that the signal processing circuit 250 can be implemented using other circuit structures without departing from the scope of the present disclosure.

The voltage divider 252 is configured to generate a voltage signal $S_{DIV}$ according to the tracking signal $S_{TC}$. By way of example but not limitation, the voltage divider 252 may include a transistor $M_{20}$ (implemented using an n-channel transistor) and k transistors $M_{21}$-$M_{2k}$ (each implemented using a p-channel transistor), where k is an integer. A control terminal of each transistor is coupled to the tracking signal $S_{TC}$. When the tracking signal $S_{TC}$ goes high, the voltage signal $S_{DIV}$ can have a signal level that is determined according to the number of p-channel transistors.

The Schmitt trigger 254, coupled to the voltage divider 252, is configured to receive the voltage signal $S_{DIV}$ and produce a voltage signal STG that changes its state according to different threshold levels. The Schmitt trigger 254 can be used to increase the noise immunity in the POC circuit 210. By way of example but not limitation, the Schmitt trigger 254 may include a plurality of transistors $M_{41}$-$M_{46}$. Each of the transistors $M_{41}$, $M_{42}$ and $M_{45}$ is implemented using a p-channel transistors; each of the transistors $M_{43}$, $M_{44}$ and $M_{46}$ is implemented using an n-channel transistors.

The buffer circuit 256, coupled to the Schmitt trigger 254, is configured to buffer the voltage signal STG and accordingly generate the POC signal $S_{POC}$. The buffer circuit 256 can be used to increase drive strength of the POC circuit 210. By way of example but not limitation, the buffer circuit 256 may include three cascaded inverter circuits 2561-2563. Each inverter circuit can be implemented using a p-channel transistor (i.e. one of the transistors $M_{61}$, $M_{63}$ and $M_{65}$) and an n-channel transistor (i.e. one of the transistors $M_{62}$, $M_{64}$ and $M_{66}$).

The voltage tracking circuit 230, coupled to the supply voltage VDD through a resistive element R, may include the circuit paths CP1 and CP2 to emulate the operation the signal generator circuit 104. By way of example but not limitation, the signal generator circuit 104 may include a pull-up circuit path and a pull-down circuit path. The fight between the pull-up and pull-down circuit paths will affect a signal level of the output signal $S_{OUT}$. The voltage tracking circuit 230 can utilize the circuit paths CP1 and CP2 to emulate the fighting pull-up and pull-down circuit paths. As another example, the signal generator circuit 104 may include a current path for outputting a load current. The voltage tracking circuit 230 can utilize the circuit paths CP1 and CP2 to simulate the establishment of the current path.

In the embodiment shown in FIG. 2, the circuit path CP1 is coupled between the supply terminal $T_{SP}$ and the output terminal $T_{OUT}$ of the voltage tracking circuit 130; the circuit path CP2 is coupled between the output terminal $T_{OUT}$ and the reference terminal $T_{REF}$ of the voltage tracking circuit 230. The supply terminal $T_{SP}$ is coupled to the supply voltage VDDIO, and the reference terminal $T_{REF}$ is coupled to a reference voltage VSS (e.g. a ground voltage or a voltage lower than the supply voltage VDDIO). When the supply voltage VDDIO is ready and the supply voltage VDD is unready, the voltage tracking circuit 230 is configured to turn on the circuit path CP1 according to the POC signal $S_{POC}$, control a conduction status of the circuit path CP2 according to the supply voltage VDD, and generate the tracking signal $S_{TIO}$ at the output terminal $T_{OUT}$.

For example, an increase in the supply voltage VDD can cause the circuit path CP2 to become more conductive, resulting in an increase in the current flowing through the circuit path CP2. When the supply voltage VDD reaches a level sufficient for the signal generator circuit 104 to operate properly, the current flowing through the circuit path CP2 can reach a level to cause the tracking signal $S_{TIO}$ to transition from a logic level to another logic level. Thus, the tracking signal $S_{TIO}$ can indicate if the supply voltage VDD becomes ready for use by the signal generator circuit 104.

In operation, when the supply voltage VDDIO is ready, the tracking signal $S_{TIO}$ may stay at a first logic level before the supply voltage VDD becomes ready for use by the signal generator circuit 104. In addition, the signal generator circuit 104 can set the output signal $S_{OUT}$ to a predetermined level according to the POC signal $S_{POC}$ sent from the signal generator circuit 220. The circuit path CP1 can be turned on according to the POC signal $S_{POC}$. Note that an increase in the supply voltage VDD can cause the circuit path CP2 to become more conductive, resulting in an increase in the current flowing through the circuit path CP2.

When the supply voltage VDD reaches a level sufficient for the signal generator circuit 104 to operate properly, the current flowing through the circuit path CP2 can be sufficient to cause the tracking signal $S_{TIO}$ to transition from the first logic level to a second logic level. For example, when the supply voltage VDD reaches a threshold level to turn on the circuit path CP2, the tracking signal $S_{TIO}$ can transition to the second logic level. Accordingly, the signal generator circuit 220 can output the POC signal $S_{POC}$ that transitions from one logic level to another logic level. The signal generator circuit 104 generate the output signal $S_{OUT}$ in response to the input signal $S_{IN}$.

Additionally or alternatively, when each of the supply voltages VDD and VDDIO is ready, the voltage tracking circuit 230 can turn off the circuit path CP1 according to the POC signal $S_{POC}$. The tracking signal $S_{TIO}$ can stay at the second logic level. When the supply voltage VDD reduces to a level insufficient for the signal generator circuit 104 to operate properly, the tracking signal $S_{TIO}$ can transition back to the first logic level to indicate that the supply voltage VDD becomes unready.

Some implementations of a voltage tracking circuit employed in the proposed POC scheme are provided below for illustrative purposes, and should not construed as limiting. Other voltage tracking structures that can track the behavior of an interface circuit between different power domains in an I/O circuit are within the contemplated scope of the present disclosure.

Figure 3:
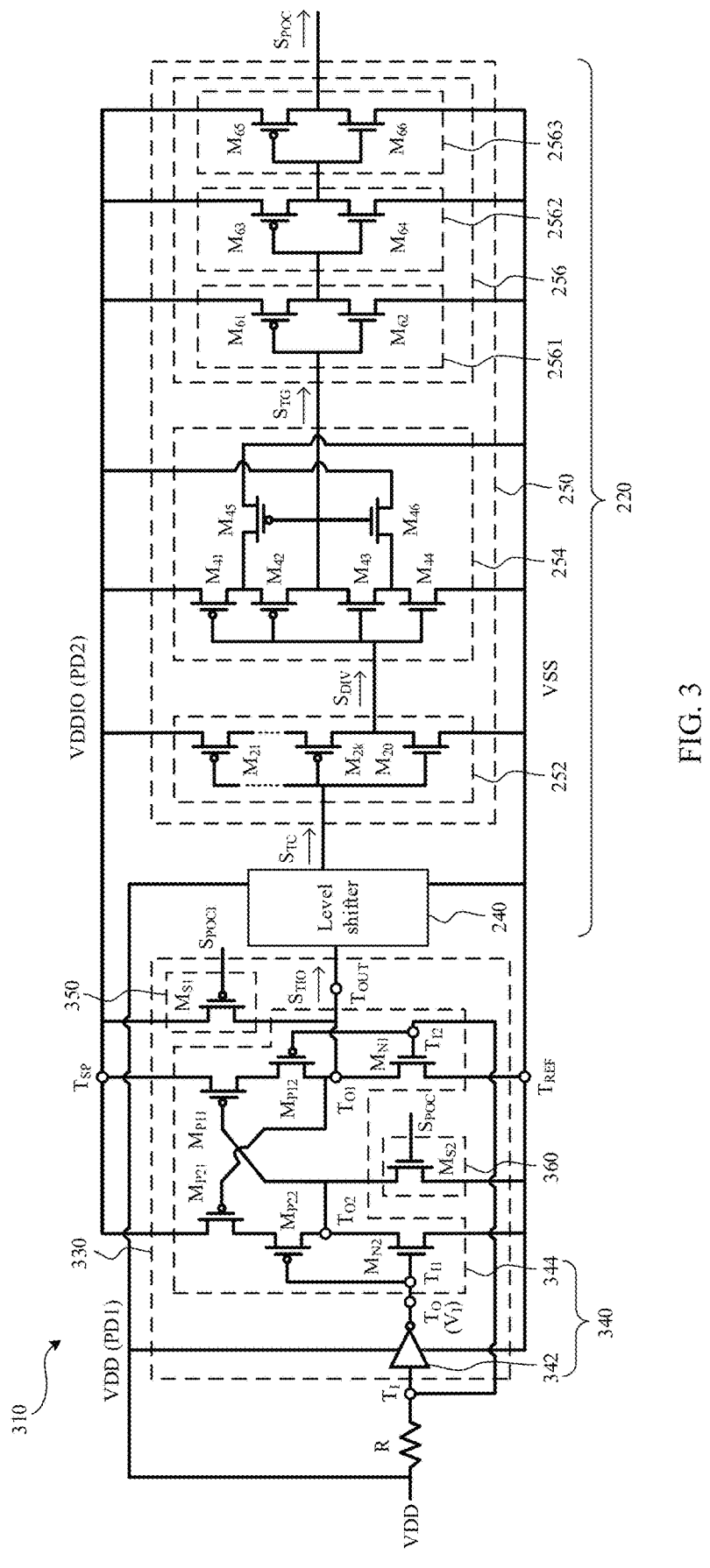
FIG. 3 illustrates an implementation of the power-on control circuit shown in FIG. 1 in accordance with some embodiments of the present disclosure.

Referring firstly to FIG. 3, an implementation of the POC circuit 110 shown in FIG. 1 is illustrated in accordance with some embodiments of the present disclosure. The POC circuit 310 shown in FIG. 3 is similar/identical to the POC circuit 210 shown in FIG. 2 except for the voltage tracking circuit 330.

The voltage tracking circuit 330 includes, but is not limited to, a level shifter 340, a switch 350 and a switch 360. The level shifter 340 is supplied/powered by the supply voltages VDD and VDDIO. The level shifter 340 can be configured to convert the supply voltage VDD into the tracking signal $S_{TIO}$, and provide the tracking signal $S_{TIO}$ at the output terminal $T_{OUT}$. In the example of FIG. 3, the level shifter 340 can be implemented using a latch type level shifter, which includes but not limited to an inverter circuit 342 and a latch circuit 344. The inverter circuit 342 and the latch circuit 344 are powered by the supply voltage VDD and the supply voltage VDDIO, respectively.

The input terminal $T_I$ of the inverter circuit 342 is coupled to the supply voltage VDD through the resistive element R. The inverter circuit 342 is arranged to invert the supply voltage VDD to generate an inverted signal $V_1$ operative in the power domain PD1. The input terminal $T_{I1}$ and the input terminal $T_{I2}$ of the latch circuit 344 are coupled to the output terminal $T_O$ and the input terminal $T_I$ of the inverter circuit 342, respectively. The output terminal $T_{O1}$ of the latch circuit 344 is coupled to the output terminal $T_{OUT}$. The latch circuit 344 can be configured to generate the tracking signal $S_{TIO}$ at the output terminal $T_{O1}$ according to respective signal levels at the input terminals $T_{I1}$ and $T_{I2}$.

The latch circuit 344 may be implemented using, but is not limited to, a plurality of transistors $M_{P11}$, $M_{P12}$, $M_{N1}$, $M_{P21}$, $M_{P22}$ and $M_{N2}$. Each of the transistors $M_{P11}$, $M_{P12}$, $M_{P21}$ and $M_{P22}$ can be implemented using a p-channel transistor; each of the transistors $M_{N1}$ and $M_{N2}$ can be implemented using an n-channel transistor. The gates of the transistors $M_{P12}$ and $M_{N1}$ are coupled to the input terminal $T_I$ of the inverter circuit 342, and the gates of the transistors $M_{P22}$ and $M_{N2}$ are coupled to the output terminal $T_O$ of the inverter circuit 342. In addition, the gate of the transistor $M_{P11}$ is coupled to the output terminal $T_{O2}$ of the latch circuit 344, and the gate of the transistor $M_{P21}$ is coupled to the output terminal $T_{O1}$ of the latch circuit 344.

Each of the switches 350 and 360 can be arranged for selectively coupling the supply voltage VDDIO to the output terminal $T_{OUT}$ according to the POC signal $S_{POC}$. For example, when the switch 350 is turned on, the supply voltage VDDIO can be coupled to the output terminal $T_{OUT}$ through the switch 350. As another example, when the switch 360 is turned on, the transistor $M_{P11}$ is turned on since the gate of the transistor $M_{P11}$ is coupled to the reference voltage VSS. The supply voltage VDDIO can be coupled to the output terminal $T_{OUT}$ through the transistors $M_{P11}$ and $M_{P12}$ when the transistor $M_{P12}$ is turned on.

In the present embodiment, the switch 350 is selectively coupled between the supply terminal $T_{SP}$ (i.e. a supply terminal of the latch circuit 344) and the output terminal $T_{O1}$ according to the POC signal $S_{POC}$. For example, when the supply voltage VDDIO is ready and the supply voltage VDD is unready, the switch 350 is turned on; when each of the supply voltages VDD and VDDIO is ready, the switch 350 is turned off.

In addition, the switch 360 is selectively coupled between the output terminal $T_{O2}$ and the reference voltage VSS according to the POC signal $S_{POC}$. When one of the switches 350 and 360 is turned on, the other of the switches 350 and 360 is turned off. For example, the switches 350 and 360 can be implemented using the transistors $M_{S1}$ and $M_{S2}$ (i.e. a p-channel transistor and an n-channel transistor), respectively. The gate of the transistor $M_{S1}$ is coupled to an inverted signal $S_{POCI}$ of the POC signal $S_{POC}$, and the gate of the transistor $M_{S2}$ is coupled to the POC signal $S_{POC}$.

Note that the transistors $M_{P11}$ and $M_{P12}$ can serve as a pull-up path of the latch circuit 344. This pull-up path and the switch 350 are connected in parallel between the supply terminal $T_{SP}$ and the output terminal $T_{OUT}$ to form a circuit path that can serve as an embodiment of the circuit path CP1 shown in FIG. 2. In addition, the transistor $M_{N1}$ can form a pull-down path of the latch circuit 344, which can serve as an embodiment of the circuit path CP2 shown in FIG. 2.

Figure 4:
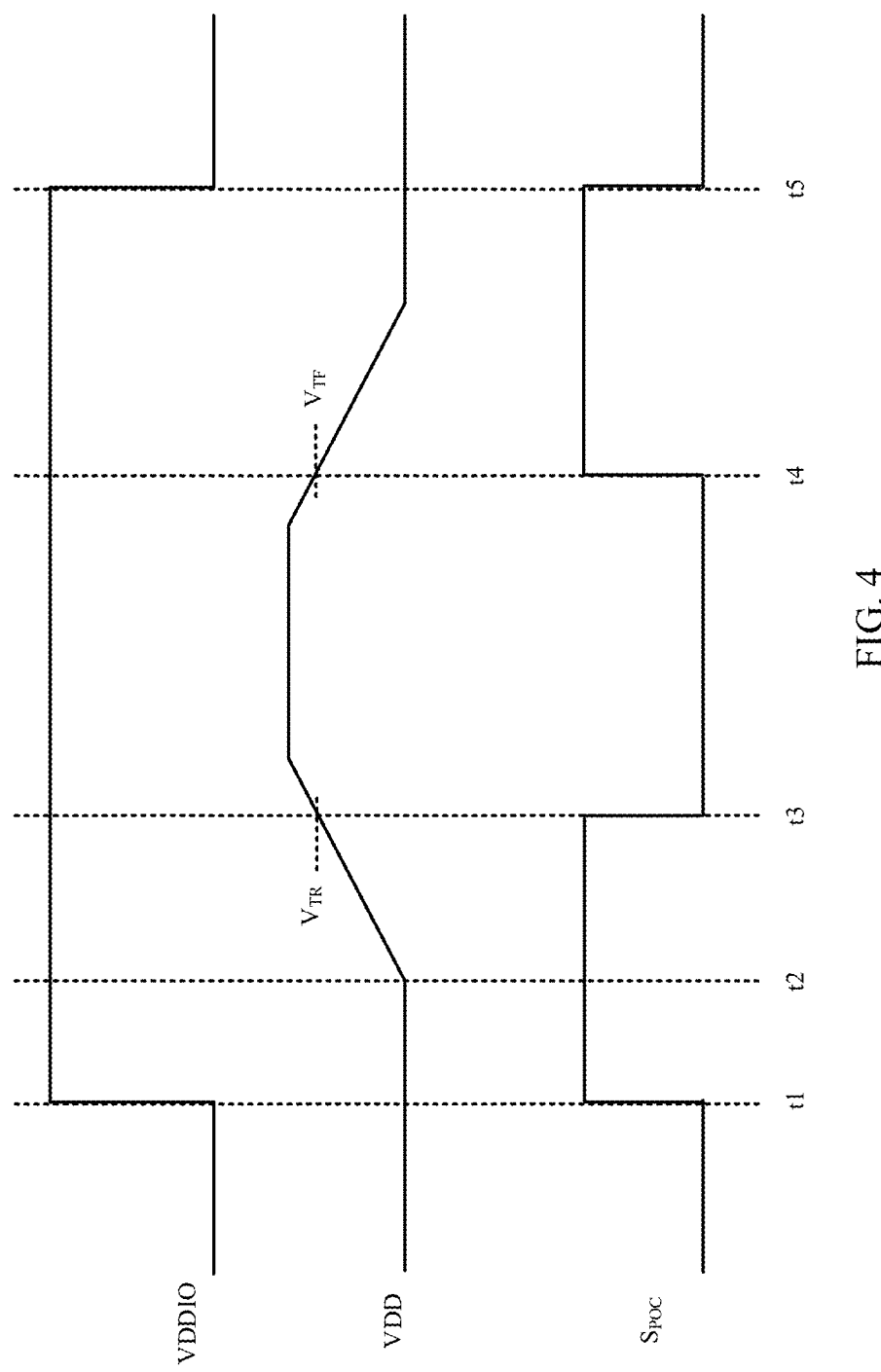
FIG. 4 illustrates signal waveforms associated with operation of the power-on control circuit shown in FIG. 3 in accordance with some embodiments of the present disclosure.

FIG. 4 illustrates signal waveforms associated with operation of the POC circuit 310 shown in FIG. 3 in accordance with some embodiments of the present disclosure. Referring to FIG. 4 and also to FIG. 3, prior to time t1, each of the power domains PD1 and PD2 is unpowered. Thus, each of the supply voltages VDD and VDDIO is low, and each of the inverter 342 and the latch circuit 344 is inactive. The respective signal levels at the input terminals $T_{I1}$ and $T_{I2}$ are low, and the respective signal levels at the output terminals $T_{O1}$ and $T_{O2}$ are low. Similarly, the level shifter 240, the voltage divider 252, the Schmitt trigger 254 and the buffer circuit 256 are inactive since each of the power domains PD1 and PD2 is unpowered. Each of the tracking signal $S_{TC}$, the voltage signal $S_{DIV}$, the voltage signal $S_{TG}$, the POC signal $S_{POC}$ and the inverted signal $S_{POCI}$ stays at a low level.

At time t1, the power domain PD2 is powered up, and the supply voltage VDDIO starts to rise. In the meantime, the supply voltage VDD stays at a low level since the power domain PD1 is in a powered off state. As the respective gates of the transistors $M_{P11}$, $M_{P12}$ and $M_{S1}$ are at low voltage levels, the transistors $M_{P11}$, $M_{P12}$ and $M_{S1}$ are turned on when the supply voltage VDDIO increases to a certain level. The signal level of the tracking signal $S_{TTO}$ increases when the transistors $M_{P11}$, $M_{P12}$ and $M_{S1}$ are turned on. The tracking signal $S_{TTO}$ can reach a level sufficient to keep the tracking signal $S_{TC}$ at a low level. In addition, the transistors $M_{21}$-$M_{2k}$ can be turned on according to the supply voltage VDDIO and the tracking signal $S_{TC}$ at a low level, thereby increasing a signal level of the voltage signal $S_{DIV}$. When the voltage signal $S_{DIV}$ reaches a level sufficient for turning on the transistors $M_{43}$ and $M_{44}$, the voltage signal $S_{TG}$ can be kept at a low level. The buffer circuit 256 can generate the POC signal $S_{POC}$ at a high level according to the voltage signal $S_{TG}$.

Between time t1 and time t2, the POC signal $S_{POC}$ can stay at a logic high level after the supply voltage VDDIO becomes ready or reaches a logic high level. The transistor $M_{S2}$ is turned on according to the POC signal $S_{POC}$ to thereby keep the output terminal $T_{O2}$ at a low voltage level.

At time t2, the power domain PD1 is powered up, and the supply voltage VDD starts to rise. The pull-down path of the inverter circuit 342 (not shown), e.g. an n-channel transistor, and the transistor $M_{N1}$ can be partially or fully turned on according to the supply voltage VDD. Note that during a low-to-high level transition of the supply voltage VDD, the transistor $M_{N1}$ (e.g. a pull-down transistor) can draw a current out of the output terminal $T_{O1}$, and fight against the transistors $M_{P11}$, $M_{P12}$ and $M_{S1}$ (e.g. pull-up transistors).

At time t3, the supply voltage VDD reaches a threshold level $V_{TR}$ such that the signal level of the tracking signal $S_{TTO}$ begins to fall. The level shifter 240 can output the tracking signal $S_{TC}$ that begins to transition from a low level to a high level. Note that this threshold level $V_{TR}$ can be regarded as a minimum level of the supply voltage VDD (e.g. a minimum core supply voltage level) that is sufficient for the I/O circuit 102 (or the signal generator circuit 104) shown in FIG. 1 to operate properly. In addition, the transistor $M_{20}$ starts to turn on when the tracking signal $S_{TC}$ increases to a certain level, thereby decreasing a signal level of the voltage signal $S_{DIV}$. When the voltage signal $S_{DIV}$ reduces to a level sufficient for turning on the transistors $M_{41}$ and $M_{42}$, the voltage signal $S_{TG}$ can be kept at a high level. The buffer circuit 256 can generate the POC signal $S_{POC}$ at a low level according to the voltage signal $S_{TG}$.

Between time t3 and time t4, the POC signal $S_{POC}$ can stay at a logic low level after the supply voltage VDD becomes ready or reaches a logic high level. In addition, when each of the supply voltages VDD and VDDIO is ready, each of the transistors $M_{S1}$, $M_{S2}$, $M_{P11}$ and $M_{P12}$ is turned off, and each of the transistors $M_{P21}$ and $M_{P22}$ is turned on. The tracking signal $S_{TTO}$ can be kept at a low level.

At time t4, the supply voltage VDD may decrease to a threshold level $V_{TF}$ that is insufficient for the level shifter 240 to operate properly. The tracking signal $S_{TC}$ will go low, thus turning on the transistors $M_{21}$-$M_{2k}$ to increase a signal level of the voltage signal $S_{DIV}$. When the voltage signal $S_{DIV}$ reaches a level sufficient for turning on the transistors $M_{43}$ and $M_{44}$, the voltage signal $S_{TG}$ will go low. The buffer circuit 256 can generate the POC signal $S_{POC}$ at a high level according to the voltage signal $S_{TG}$.

Between time t4 and time t5, the POC signal $S_{POC}$ can stay at a logic high level after the supply voltage VDD becomes unready or falls below the threshold level $V_{TF}$. The transistor $M_{S2}$ is turned on according to the POC signal $S_{POC}$ to thereby keep the output terminal $T_{O2}$ at a low voltage level. In addition, the transistors $M_{S1}$, $M_{P11}$ and $M_{P12}$ are turned on to keep the output terminal $T_{O1}$ at a high voltage level, At time t5, the power domain PD2 is powered off, and the supply voltage VDDIO starts to fall. As each of the power domains PD1 and PD2 is unpowered, the POC signal $S_{POC}$ transitions to a logic low level.

Note that the proposed POC scheme not only can track the behavior of an interface circuit between different power domains in an I/O circuit, but also reduces/prevents the occurrence of an ambiguous region that causes a functioning block to exhibit unpredictable behavior.

Figure 5:
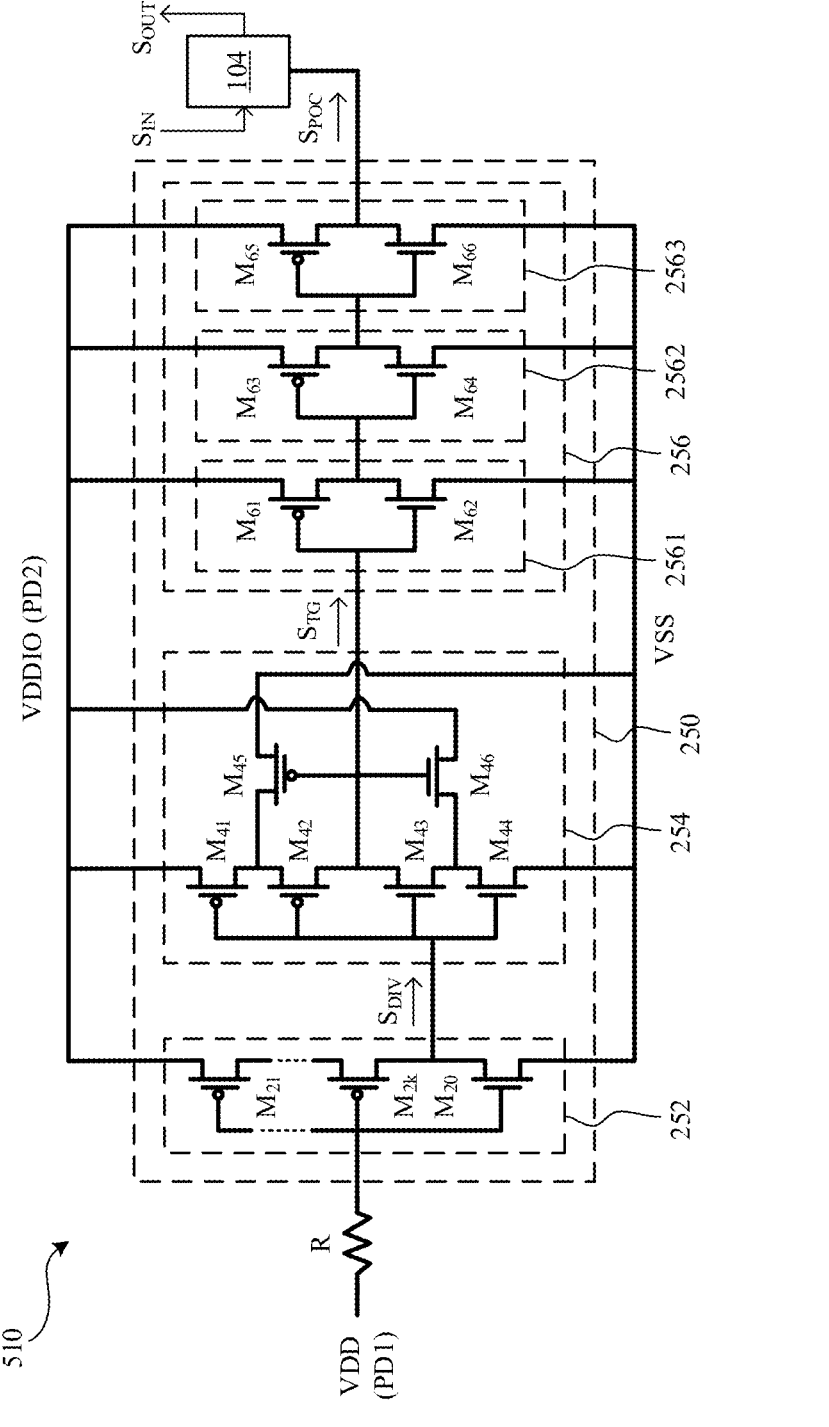
FIG. 5 illustrates an implementation of a power-on control circuit in accordance with some embodiments.
Figure 6:
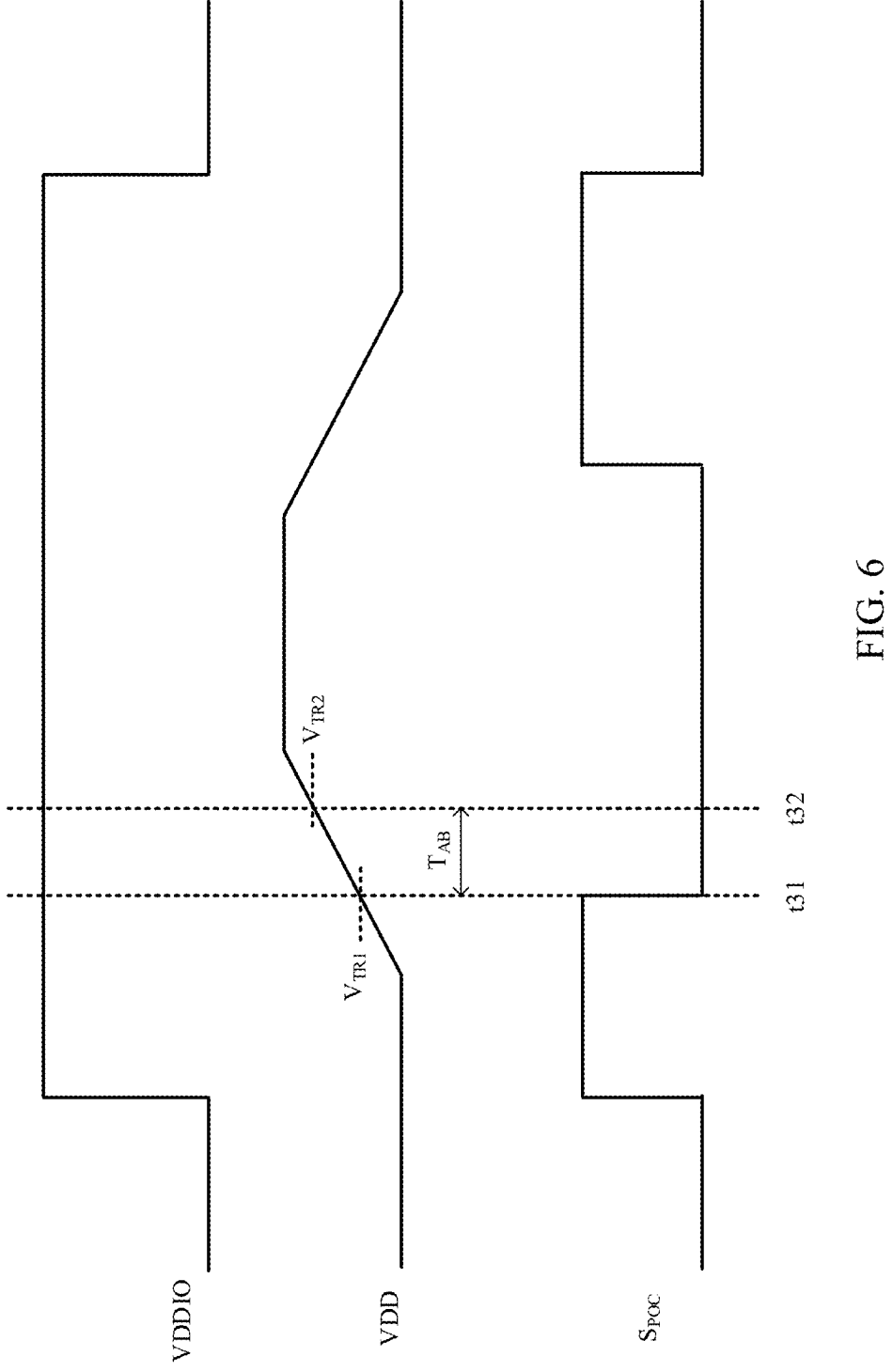
FIG. 6 illustrates signal waveforms associated with operation of the power-on control circuit shown in FIG. 5 in accordance with some embodiments.

For example, unlike the configuration shown in FIG. 3, where the voltage tracking circuit 330 is arranged between the resistor element R and the signal processing circuit 250, FIG. 5 illustrates a POC circuit where the processing circuit 250 is directly connected to the resistive element R in accordance with some embodiments. Signal waveforms associated with operation of the POC circuit 510 are illustrated in FIG. 6. Referring to FIG. 5 and FIG. 6, at time t31, the supply voltage VDD reaches a threshold level $V_{TR1}$ to turn on transistor $M_{20}$, thereby decreasing a signal level of the voltage signal $S_{DIV}$. In addition, the transistors $M_{41}$ and $M_{42}$ can be turned on to raise the signal level of the voltage signal $S_{TG}$. The buffer circuit 256 can generate the POC signal $S_{POC}$ at a logic low level according to the voltage signal $S_{TG}$. The signal generator circuit 104 may release a functioning block from a reset state according to the POC signal $S_{POC}$ sent from the POC circuit 510. However, the supply voltage VDD does not become ready for use by the signal generator circuit 104 until the supply voltage VDD reaches a threshold level $V_{TR2}$ higher than the threshold level $V_{TR1}$ (i.e. at time t32). Thus, the signal generator circuit 104 will release the functioning block from the reset state before the supply voltage VDD becomes ready. The functioning block may exhibit unpredictable behavior during a time interval TAB between time t31 and time t32 (i.e. an ambiguous region).

In contrast, the POC signal $S_{POC}$ shown in FIG. 4 can stay at the logic high level before the supply voltage VDD reaches the threshold level $V_{TR}$ (e.g. between time t1 and time t3), and go low after the supply voltage VDD reaches the threshold level $V_{TR}$. The POC circuit 310 shown in FIG. 3 can control the operation of the signal generator circuit 104 without introducing an ambiguous region.

The circuit structures described above are provided for illustrative purposes, and are not intended to limit the scope of the present disclosure. In some embodiments, the voltage tracking circuit 330 can be implemented using different circuit topologies as long as the voltage tracking circuit 330 is a replica of an interface circuit between different power domains in the I/O circuit 102. In some embodiments, the voltage tracking circuit 330 can be implemented using different circuit topologies as long as the voltage tracking circuit 330 is capable of emulating the response of the interface circuit to the fighting pull-up and pull-down circuit paths. In some embodiments, the voltage tracking circuit 330 can be implemented using different circuit topologies as long as the voltage tracking circuit 330 is capable of tracking the behavior of the interface circuit according to the POC signal $S_{POC}$.

Figure 7:
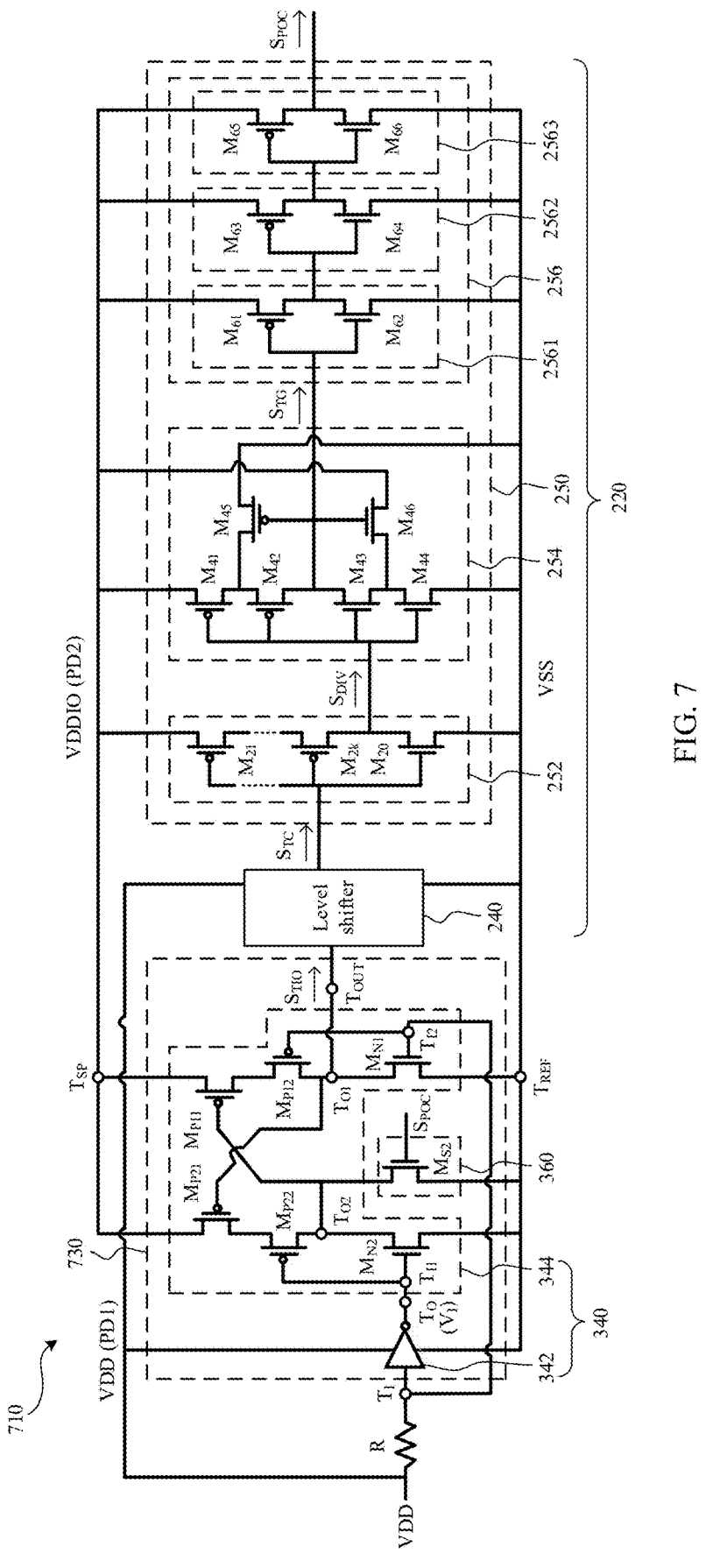
FIG. 7 illustrates an implementation of the power-on control circuit shown in FIG. 1 in accordance with some embodiments of the present disclosure.

For example, referring to FIG. 7, an implementation of the POC circuit 110 shown in FIG. 1 is illustrated in accordance with some embodiments of the present disclosure. The POC circuit 710 shown in FIG. 7 is similar/identical to the POC circuit 310 shown in FIG. 3 except that the switch 350 shown in FIG. 3 is not employed in the voltage tracking circuit 730. In addition, the transistors $M_{P11}$ and $M_{P12}$ shown in FIG. 7 can serve as an embodiment of the circuit path CP1 shown in FIG. 2. In some examples, the voltage tracking circuit 730 can be a replica of the signal generator circuit 104. As those skilled in the art should appreciate the operation of the POC circuit 710 shown in FIG. 7 after reading the above paragraphs directed to FIG. 1 to FIG. 6, further description is omitted here for brevity.

Figure 8:
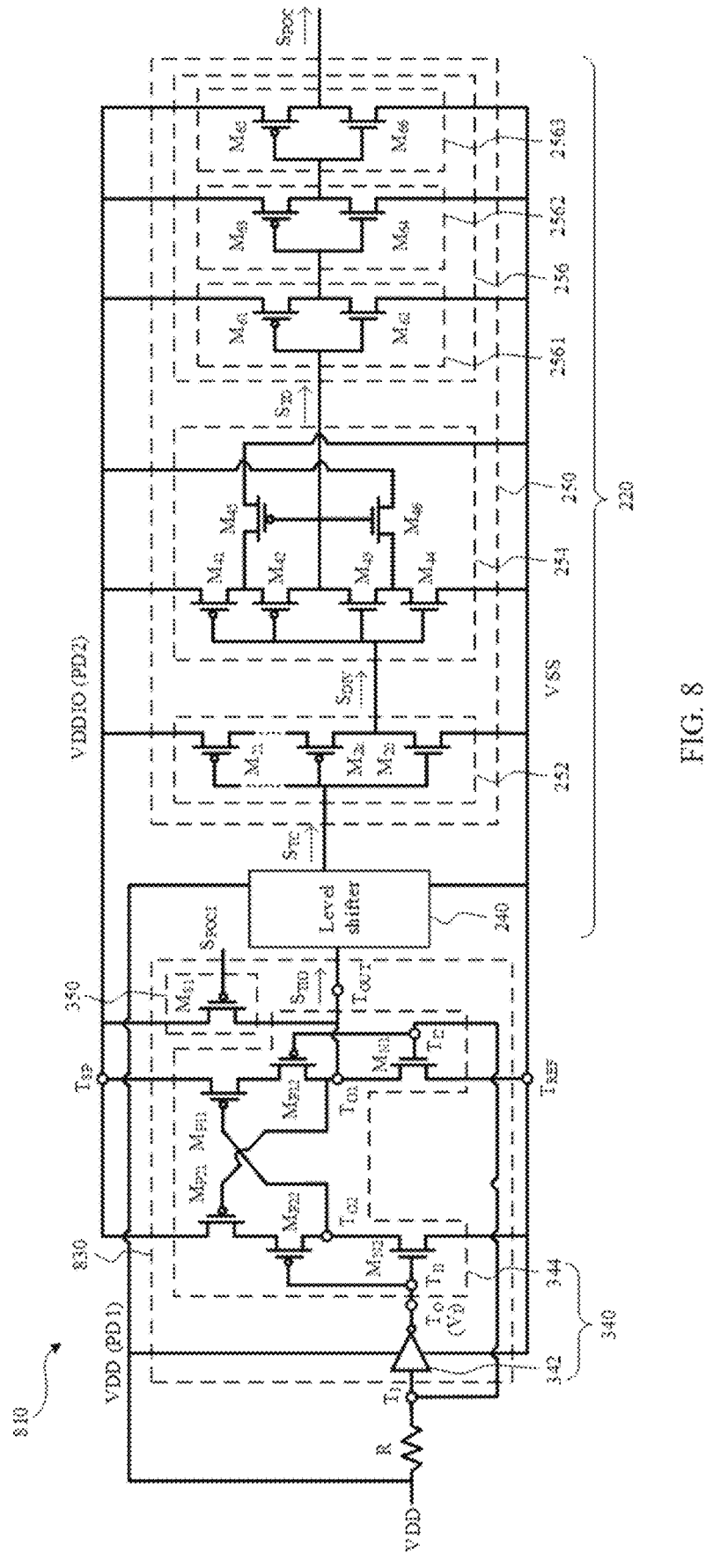
FIG. 8 illustrates an implementation of the power-on control circuit shown in FIG. 1 in accordance with some embodiments of the present disclosure.

FIG. 8 illustrates another implementation of the POC circuit 110 shown in FIG. 1 in accordance with some embodiments of the present disclosure. The POC circuit 810 shown in FIG. 8 is similar/identical to the POC circuit 310 shown in FIG. 3 except that the switch 360 shown in FIG. 3 is not employed in the voltage tracking circuit 830. In some examples, the voltage tracking circuit 830 can be a replica of the signal generator circuit 104. As those skilled in the art should appreciate the operation of the POC circuit 810 shown in FIG. 8 after reading the above paragraphs directed to FIG. 1 to FIG. 6, further description is omitted here for brevity.

Figure 9:
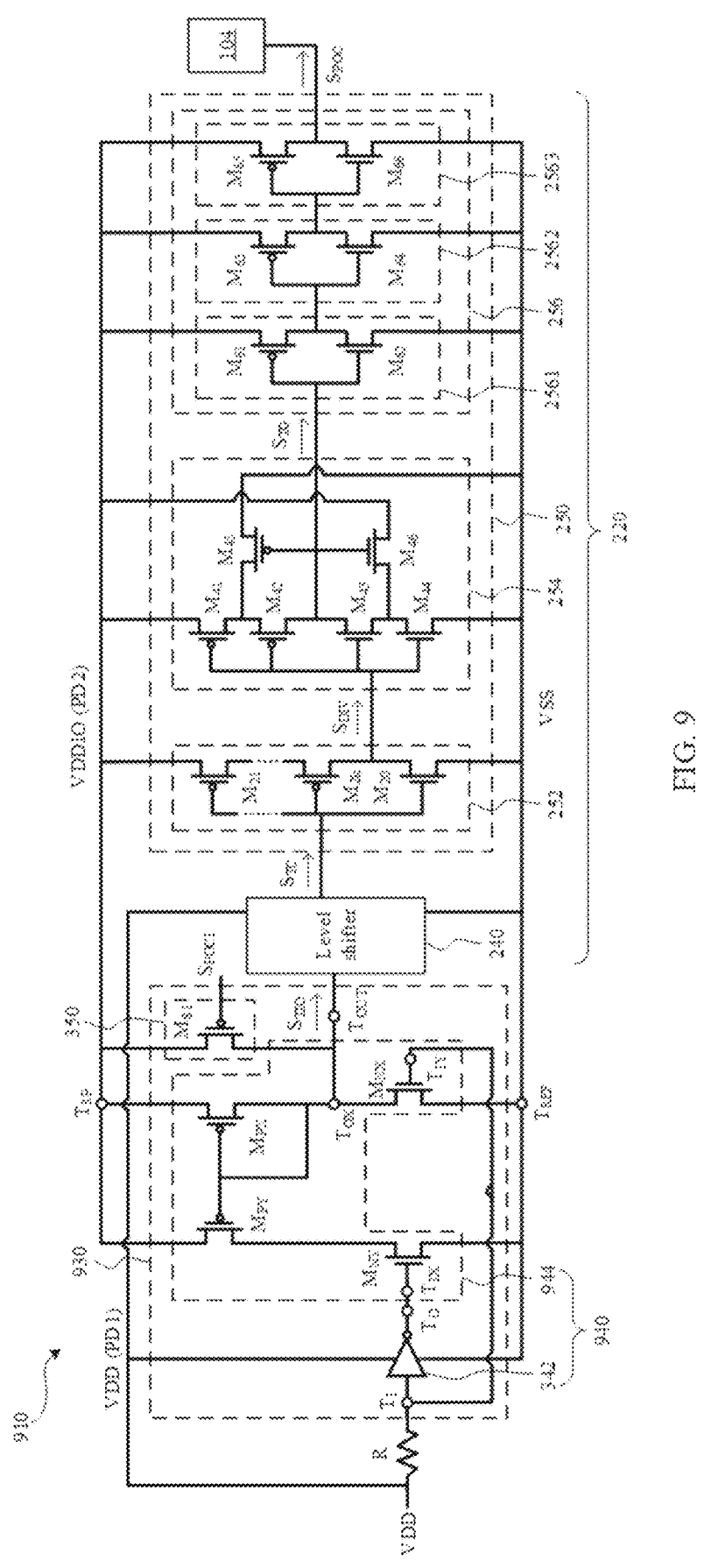
FIG. 9 illustrates an implementation of the power-on control circuit shown in FIG. 1 in accordance with some embodiments of the present disclosure.

FIG. 9 illustrates another implementation of the POC circuit 110 shown in FIG. 1 in accordance with some embodiments of the present disclosure. The POC circuit 910 shown in FIG. 9 is similar/identical to the POC circuit 310 shown in FIG. 3 except for the voltage tracking circuit 930. In the present embodiment, the voltage tracking circuit 930 may include the switch 350 shown in FIG. 3 and a level shifter 940. The level shifter 940 can be implemented using a current mode level shifter, which includes but not limited to the inverter circuit 342 shown in FIG. 3 and a current mirror circuit 944.

The current mirror circuit 944 is powered by the supply voltage VDDIO. The input terminal Tix and the input terminal Try of the current mirror circuit 944 are coupled to the output terminal $T_O$ and the input terminal $T_I$ of the inverter circuit 342, respectively. The output terminal Tox of the current mirror circuit 944 is coupled to the output terminal $T_{OUT}$. The current mirror circuit 944 may be implemented using, but is not limited to, a plurality of transistors $M_{PX}$, $M_{PY}$, $M_{NX}$ and $M_{NY}$. Each of the transistors $M_{PX}$ and $M_{PY}$ can be implemented using a p-channel transistor. The gates of the transistors $M_{PX}$ and $M_{PY}$ are coupled to the output terminal Tox. In addition, each of the transistors $M_{NX}$ and $M_{NY}$ can be implemented using an n-channel transistor. The gate of the transistor $M_{NX}$ is coupled to the input terminal $T_I$, and the gate of the transistor $M_{NY}$ is coupled to the output terminal $T_O$.

Note that the transistor $M_{PX}$ and the switch 350 can be connected in parallel between the supply terminal $T_{SP}$ and the output terminal $T_{OUT}$ to form a circuit path, which can serve as an embodiment of the circuit path CP1 shown in FIG. 2. In addition, the transistor $M_{NX}$ can serve as an embodiment of the circuit path CP2 shown in FIG. 2. By way of example but not limitation, the signal generator circuit 104 may include a current path for outputting a load current. The voltage tracking circuit 930 can utilize transistor $M_{PX}$, the switch 350 and the transistor $M_{NX}$ to determine if the supply voltage VDD reaches a level that is sufficient for the signal generator circuit 104 to establish the current path.

In operation, when the supply voltage VDDIO becomes ready and the supply voltage VDD is unready, the POC signal $S_{POC}$ is logic high, and the switch 350 is turned on. Next, the power domain PD1 is powered up. When the supply voltage VDD reaches a level sufficient for turning on the transistor $M_{NX}$, the signal level of the tracking signal $S_{TTO}$ begins to fall, and the level shifter 240 can output the tracking signal $S_{TC}$ that begins to transition from a low level to a high level. The transistors $M_{PX}$ and $M_{NX}$ of the current mirror circuit 944 can establish a current path for outputting a load current. In addition, the voltage signal $S_{DIV}$ can go low, the voltage signal $S_{TG}$ can go high, and the buffer circuit 256 can generate the POC signal $S_{POC}$ at a logic low level.

With the use of the voltage tracking circuit 930, the POC circuit 910 can track a minimum level of the supply voltage VDD that is sufficient for the I/O circuit 102 to operate properly. Moreover, the POC circuit 910 can reduce/prevent the occurrence of an ambiguous region that causes a functioning block to exhibit unpredictable behavior. As those skilled in the art should appreciate the operation of the POC circuit 910 shown in FIG. 9 after reading the above paragraphs directed to FIG. 1 to FIG. 8, further description is omitted here for brevity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power-on control circuit for an integrated circuit, the power-on control circuit comprising:
   a signal processing circuit, configured to generate a power-on control signal according to a first tracking signal operative in a first power domain of the integrated circuit;
   a first level shifter, coupled to the signal processing circuit, the first level shifter being configured to generate the first tracking signal according to a second tracking signal operative in a second power domain of the integrated circuit, the second power domain being different from the first power domain; and
   a voltage tracking circuit, coupled to the first level shifter, and powered by a first supply voltage operative in the first power domain and a second supply voltage operative in the second power domain, wherein the voltage tracking circuit is configured to, when the second supply voltage is ready, track the first supply voltage according to the power-on control signal, and accordingly generate the second tracking signal.

2. The power-on control circuit of claim 1, wherein when the power-on control signal at a first logic level, the voltage tracking circuit is configured to generate the second tracking signal by detecting if the first supply voltage reaches a first threshold level to become ready for use; when the power-on control signal at a second logic level different from the first logic level, the voltage tracking circuit is configured to generate the second tracking signal by detecting if the first supply voltage reaches a second threshold level to become unready for use.

3. The power-on control circuit of claim 1, wherein the voltage tracking circuit comprises:

an output terminal;

a supply terminal coupled to the second supply voltage; and a reference terminal coupled to a reference voltage;

wherein when the second supply voltage is ready and the first supply voltage is unready, the voltage tracking circuit is configured to turn on a circuit path between the supply terminal and the output terminal according to the power-on control signal, control a conduction status of a circuit path between the output terminal and the reference terminal according to the first supply voltage, and generate the second tracking signal at the output terminal.

4. The power-on control circuit of claim 3, wherein when the first supply voltage reaches a threshold level to turn on the circuit path between the output terminal and the reference terminal, the second tracking signal transitions from a first logic level to a second logic level.

5. The power-on control circuit of claim 3, wherein when each of the first supply voltage and the second supply voltage is ready, the voltage tracking circuit is configured to turn off the circuit path between the supply terminal and the output terminal according to the power-on control signal.

6. The power-on control circuit of claim 1, wherein the voltage tracking circuit comprises:

a second level shifter, powered by the first supply voltage and the second supply voltage, the second level shifter being configured to convert the first supply voltage into the second tracking signal, wherein the second tracking signal is provided at an output terminal of the second level shifter; and a first switch, arranged to selectively couple the second supply voltage to the output terminal of the second level shifter according to the power-on control signal.

7. The power-on control circuit of claim 6, wherein when the second supply voltage is ready and the first supply voltage is unready, the first switch is turned on; when each of the first supply voltage and the second supply voltage is ready, the first switch is turned off.

8. The power-on control circuit of claim 6, wherein the second level shifter comprises:

an inverter circuit, powered by the first supply voltage, wherein an input terminal of the inverter circuit is coupled to the first supply voltage; and a latch circuit, powered by the second supply voltage, wherein a first output terminal of the latch circuit is coupled to the output terminal of the second level shifter, a first input terminal of the latch circuit is coupled to an output terminal of the inverter circuit, and a second input terminal of the latch circuit is coupled to the input terminal of the inverter circuit.

9. The power-on control circuit of claim 8, wherein a supply terminal of the latch circuit is coupled to the second supply voltage, and the first switch is selectively coupled between the supply terminal and the first output terminal of the latch circuit according to the power-on control signal; the second level shifter comprises:

a second switch, selectively coupled between a second output terminal of the latch circuit to a reference voltage according to the power-on control signal, wherein when one of the first switch and the second switch is turned on, the other of the first switch and the second switch is turned off.

10. The power-on control circuit of claim 6, wherein the second level shifter comprises:

an inverter circuit, powered by the first supply voltage, wherein an input terminal of the inverter circuit is coupled to the first supply voltage; and a current mirror circuit, powered by the second supply voltage, wherein an output terminal of the current mirror circuit is coupled to the output terminal of the second level shifter, a first input terminal of the current mirror circuit is coupled to an output terminal of the inverter circuit, and a second input terminal of the current mirror circuit is coupled to the input terminal of the inverter circuit.

11. The power-on control circuit of claim 1, wherein the voltage tracking circuit comprises:

an inverter circuit, powered by the first supply voltage, wherein an input terminal of the inverter circuit is coupled to the first supply voltage;

a latch circuit, powered by the second supply voltage, wherein a first output terminal of the latch circuit is arranged to provide the second tracking signal, a first input terminal of the latch circuit is coupled to an output terminal of the inverter circuit, and a second input terminal of the latch circuit is coupled to the input terminal of the inverter circuit; and a switch, selectively coupled between a second output terminal of the latch circuit and a reference voltage according to the power-on control signal.

12. The power-on control circuit of claim 1, wherein the first level shifter comprises an inverter circuit powered by the first supply voltage; the inverter circuit is configured to generate the first tracking signal by inverting the second tracking signal.

13. An integrated circuit having multiple power domains, comprising:

an input/output (I/O) circuit controlled by a power-on control signal, the I/O circuit comprising a first signal generator circuit powered by a first supply voltage and a second supply voltage, wherein the first signal generator is configured to receive an input signal, and generate an output signal according to the power-on control signal; the first supply voltage and the input signal are operative in a first power domain of the integrated circuit; the second supply voltage and the output signal are operative in a second power domain of the integrated circuit; and a power-on control circuit, coupled to the first signal generator circuit and configured to generate the power-on control signal, the power-on control circuit comprising:

a second signal generator circuit, configured to generate the power-on control signal according to a tracking signal operative in the second power domain; and a voltage tracking circuit, coupled to the second signal generator circuit, and powered by the first supply voltage and the second supply voltage, wherein the voltage tracking circuit is configured to, when the second supply voltage is ready, track the first supply voltage according to the power-on control signal, and accordingly generate the tracking signal.

14. The integrated circuit of claim 13, wherein the voltage tracking circuit is a replica of the first signal generator circuit.

15. The integrated circuit of claim 13, wherein the power-on control signal is at a first logic level before the first supply voltage reaches a threshold level to become ready for use by the first signal generator circuit; the power-on control signal transitions from the first logic level to a second logic level when or after the first supply voltage reaches the threshold level to become ready for use by the first signal generator circuit.

16. The integrated circuit of claim 13, wherein when the power-on control signal at a first logic level, the voltage tracking circuit is configured to generate the tracking signal by detecting if the first supply voltage reaches a first threshold level to become ready for use; when the power-on control signal at a second logic level different from the first logic level, the voltage tracking circuit is configured to generate the tracking signal by detecting if the first supply voltage reaches a second threshold level to become unready for use.

17. The integrated circuit of claim 13, wherein the voltage tracking circuit comprises:
an output terminal;
a supply terminal coupled to the second supply voltage; and
a reference terminal coupled to a reference voltage;
wherein when the second supply voltage is ready and the first supply voltage is unready, the voltage tracking circuit is configured to turn on a circuit path between the supply terminal and the output terminal according to the power-on control signal, control a conduction status of a circuit path between the output terminal and the reference terminal according to the first supply voltage, and generate the tracking signal at the output terminal.

18. The integrated circuit of claim 13, wherein the voltage tracking circuit comprises:
a level shifter, powered by the first supply voltage and the second supply voltage, the level shifter being configured to convert the first supply voltage into the tracking signal, wherein the tracking signal is provided at an output terminal of the level shifter; and
a switch, arranged to selectively couple the second supply voltage to the output terminal of the second level shifter according to the power-on control signal.

19. The integrated circuit of claim 13, wherein the voltage tracking circuit comprises:
an inverter circuit, powered by the first supply voltage, wherein an input terminal of the inverter circuit is coupled to the first supply voltage;
a latch circuit, powered by the second supply voltage, wherein a first output terminal of the latch circuit is arranged to provide the tracking signal, a first input terminal of the latch circuit is coupled to an output terminal of the inverter circuit, and a second input terminal of the latch circuit is coupled to the input terminal of the inverter circuit; and
a switch, selectively coupled between a second output terminal of the latch circuit and a reference voltage according to the power-on control signal.

20. The integrated circuit of claim 13, wherein the second signal generator circuit comprises:
an inverter circuit, coupled to the voltage tracking circuit and powered by the first supply voltage, the inverter circuit being configured to invert the tracking signal to generate an inverted signal operative in the first power domain; and
a signal processing circuit, coupled to the inverter circuit, the signal processing circuit being configured to generate the power-on control signal according to the inverted signal.

* * * * *